United States Patent [19]
Gabor et al.

[11] Patent Number: 5,364,660
[45] Date of Patent: Nov. 15, 1994

[54] CONTINUOUS ATMOSPHERIC PRESSURE CVD COATING OF FIBERS

[75] Inventors: Thomas Gabor, Maplewood; James M. O'Kelly, New Brighton, both of Minn.

[73] Assignee: Minnesota Mining and Manufacturing Company, St. Paul, Minn.

[21] Appl. No.: 383,923

[22] Filed: Jul. 21, 1989

[51] Int. Cl.$^5$ ............................................. C23C 16/00
[52] U.S. Cl. ............................... 427/255.3; 427/255.5
[58] Field of Search ............... 427/255.3, 255.5, 255.2, 427/248.1, 255, 249, 250, 251, 255.1, 122, 124, 126.3; 118/718, 715

[56] References Cited

U.S. PATENT DOCUMENTS

| | | | |
|---|---|---|---|
| 3,212,926 | 10/1965 | Morelock | 117/126 |
| 3,549,424 | 12/1970 | Rice | 148/6.3 |
| 4,068,037 | 1/1978 | Debolt et al. | 428/368 |
| 4,097,624 | 6/1978 | Schladitz | 427/251 |
| 4,214,037 | 7/1980 | Glasso et al. | 428/367 |
| 4,343,836 | 8/1982 | Newkirk et al. | 427/249 |
| 4,358,473 | 11/1982 | Debolt et al. | 427/10 |
| 4,373,006 | 2/1983 | Glasso et al. | 428/368 |
| 4,642,271 | 2/1987 | Rice | 428/698 |
| 4,731,298 | 3/1988 | Shindo et al. | 428/611 |
| 4,834,020 | 5/1989 | Bartholomew et al. | 118/719 |
| 4,859,503 | 8/1989 | Bouix et al. | 427/249 |

FOREIGN PATENT DOCUMENTS 0222960 12/1986 European Pat. Off.

OTHER PUBLICATIONS

Blocher, J. M., Jr., "Deposition Technologies for Films and Coatings", Noyes Publications, pp. 335–364 (1982).
Honjo et al., Composite Interfaces, Proc. Int. Conf. 1st., pp. 101–107 (1986).
Aggour et al., Carbon, vol. 12, pp. 358–362 (1974).
Amateau, J. Compos. Mater., vol. 10, pp. 279–296 (1976).

*Primary Examiner*—Peter A. Nelson
*Attorney, Agent, or Firm*—Gary L. Griswold; Walter N. Kirn; Jeffery L. Wendt

[57] ABSTRACT

Barrier coatings are deposited onto fibrous materials at atmospheric pressure by a continuous CVD process. A relatively short furnace tube with an unrestricted outlet is used. Thus, the supply and takeup reels do not need to be contiguous with the coating part of the apparatus. This allows the periodic removal of fuzz and soot without the interruption of the coating process.

5 Claims, 6 Drawing Sheets

CONTINUOUS ATMOSPHERIC PRESSURE CVD COATING OF FIBERS

The invention herein described was made in the course of or under contract with the Naval Research Laboratory, U.S. Department of the Navy, contract number N00014-87-C-2516, sub-contract number 200-14-14P94023.

The U.S. Government has a paid-up license in this invention and the right in limited circumstances to require the patent owner to license others on reasonable terms as provided for by the terms of contract No. N00014-87-C-2516.

FIELD OF THE INVENTION

This invention relates to the coating of fibers to make them more suitable for use in fiber-reinforced composites. More specifically, the invention concerns a process for coating reinforcing fibers, and apparatus for continuously coating such fibers.

BACKGROUND OF THE INVENTION

High-performance fibers are being increasingly used as the reinforcement of plastic, metal, ceramic, and carbon matrix composites. When the composite has a ceramic matrix, the main role of the fibers is to toughen the composite to prevent brittle failure. The degree of toughness attained is greatly affected by the bond strength between the fibers and matrix. If the bond strength is too high, cracks propagate through the fibers; if too low, the load is not transferred to them.

The most demanding of these applications are those involving high operating temperatures. In such environments, the matrix may chemically react with, or dissolve the fiber. Although chemical reaction may in some cases be beneficial, it usually leads to drastic reductions in strength and toughness. In many cases, these high-temperature problems can be solved by applying barrier coatings on the fibers by chemical vapor deposition (CVD). As the name implies, CVD involves the deposition of coatings onto substrates by chemical reaction from the vapor phase. The technique is widely known and a number of review articles exist on the subject. See, for example, Blocher, J. M., Jr., "Deposition Technologies for Films and Coatings", Noyes Publications, page 335-364 (1982). Blocher discusses the roles of thermodynamics in predicting the possibility of deposition with various reactants under given temperatures and reactant partial pressures, of kinetics on the rate of deposition, and of transport processes such as diffusion and heat transfer in CVD. This reference also describes the effects of these variables and their interactions on coating properties.

The application of a coating by CVD to a monofilament is a fairly simple procedure. See, for example, EPO Pat. Publ. No. 0,222,960 (Schachner) where a monofilament is drawn and coated by CVD in-line. When the monofilament is electrically conductive, it can be heated resistively during CVD, thereby activating the chemical deposition reaction primarily on the monofilament and not in the gas phase or on the unheated wall of the tube that confines the gaseous mixture. There is a considerable amount of art describing such "cold wall" deposition systems by which CVD coatings are applied to monofilaments by continuous processes. See, for example, U.S. Pat. Nos. 3,549,424 and 4,068,037.

When coating by CVD a fiber that has multiplicity of filaments, e.g., a tow, it is necessary no diffuse the reactant(s) between the filaments. A translation of French Patent No. 2,607,840 states that:

"This vapor phase deposition, designated by the American acronym CVD, does not allow one to obtain good protection for all of the individual filaments that constitute the tow of carbon. Actually it is very difficult, if not impossible, to avoid preferential deposition, particularly in the peripheral zones of the tow, and equally, to avoid the cementing together of the filaments. These drawbacks make the process unsuitable for industrial utilization. In other words, the CVD technique, even though very attractive in theory, does not allow the control of coating thickness and homogeneity of the carbide deposit specially when, as is the case in a tow, the gaseous reaction medium diffuses poorly into the center. It follows that the individual filaments of carbon are not coated homogeneously, regularly, and with controlled thickness."

To alleviate the difficulties mentioned in the French patent, it is common to coat multiple-filament fibers by CVD at low pressures (LPCVD). This increases the mean free path of the reactants, thereby decreasing homogeneous nucleation and the growth of soot particles in the gas phase. It also facilitates the diffusion of the gases between the filaments, thus reducing the variability in coating thickness. However, such a reduced pressure coating process requires building and maintaining of sophisticated, expensive equipment. See U.S. Pat. No. 4,343,836 (Newkirk et al.) In many cases, such equipment is limited to batch processes. See, for example, U.S. Pat. No. 3,212,926 (Morelock) and U.S. Pat. No. 4,214,037 (Galasso et al.), the latter of which suggests that similar coating results can be obtained in a continuous process.

Difficulties are encountered when LPCVD processes for coating a multi-filament fiber are made continuous. Deposits on the inner wall of the coating chamber gradually diminish its volume and eventually require it to be replaced. Fuzz (tangles of broken off filaments) and soot (homogeneously nucleated and grown particles) that form in the system during coating interfere with fiber movement. To prevent fiber breakage, the fuzz and soot must be periodically removed. When cleaning is required or when the fiber breaks during the coating process, the vacuum has to be broken, and after repair the system has to be pumped down. If the coating is performed at high temperatures, partial cool-down and subsequent reheating of the coating system is also required.

These difficulties demonstrate a need for a system by which a multi-filament fiber can be continuously coated by CVD at atmospheric pressure (APCVD), and such systems have been reported. See, for example, Honjo et al., *Composite Interfaces, Proc. Int. Conf. 1st*, pp. 101-107 [1986]; Aggour et al., *Carbon*, Vol. 12, pp. 358-362 [1974]; and Amateau, *J. Compos. Mater.*, Vol. 10, pp. 279-296 [1976]). However, the apparatus illustrated in each of those publications would need to be disassembled to be cleaned and so would offer little advantage over a LPCVD system such as that shown in the Newkirk patent.

U.S. Pat. No. 4,373,006 (Galasso et al.) says that "even when upwards of 10,000 fibers are bundled together to form a strand of yarn the chemical vapor deposition of silicon carbide produces an essentially uniform coating of silicon carbide over the surface each fiber even on those fibers in the center of the yarn and even on those areas of fibers which are in close proximity to one another" (col. 2, lines 57–64). It also says that carbon fibers were coated with silicon carbide "by holding the fibers in a chamber . . . maintained at a temperature of between 1100° and 1200° C. by passing them through an R.F. heated graphite susceptor" (col. 3, lines 41–49). However, there is no disclosure of the nature of the fiber-handling apparatus and no drawing.

For a detailed discussion of the advantage of coating ceramic fibers with BN for use in composites, see U.S. Pat. No. 4,642,271 (Rice). However, coating conditions are not given. It is not even stated whether APCVD or LPCVD is used, and no apparatus is illustrated.

U.S. Pat. No. 4,731,298 (Shindo et al.) concerns coating carbon fibers first with a layer of carbon and then with a metal carbide. "The carbon fibers may be in the form of yarns, tows or webs of continuous filaments. The carbon fibers may be used in the form of yarn and webs of short fibers or the like" (col. 2, lines 65–68). However, no method is disclosed; neither is any apparatus disclosed.

SUMMARY OF THE INVENTION

The present invention provides what is believed to be the first apparatus by which barrier coatings can be continuously applied by CVD to a multiplicity of filaments or fibers such as a tow of filaments or a yarn or a strip of woven fabric. Such a multiplicity of filaments or fibers is sometimes hereinafter referred to as "the fibrous material."

Briefly, the novel coating apparatus includes a furnace,
   a straight, elongated furnace tube extending through the furnace, which furnace tube is formed with
      a uniform inside diameter of sufficiently large size to receive a tool for periodic cleaning while the apparatus is in use,
      an unconstricted outlet,
      an ambient atmosphere-excluding (preferably constricted) inlet through which said fibrous material enters, and
      intake means for receiving a gaseous mixture comprising one or more reagents that can coat said fibrous material by CVD.

The apparatus permits a long length of inorganic fibrous material to be carried continuously through the gaseous mixture, the residue of which is freely exhausted through the unconstricted outlet. At the unconstricted outlet, back-diffusion of the air is kept at acceptable levels by the flux. The furnace tube can be fitted with liner that is easily replaced simply by pulling it through the outlet. This allows deposits of fuzz and soot to be periodically eliminated without interruption of the coating process and without disturbing either the inlet for the fibrous material or the intake means.

Preferably the novel coating apparatus is operated at atmospheric pressure, thus eliminating the need for the supply and takeup reels to be contiguous with the furnace tube and making it easier to remove a liner. The in-diffusion of air through the fiber inlet can be kept at acceptable levels by using a long small-diameter inlet tubing. When that inlet-tubing has a uniform, slot-like cross-sectional area, a plurality of tows, rovings or yarns can be carried side-by-side through the inlet tubing without crowding. A slot-like interior is also useful for coating strips of woven fabric.

The invention also provides a method of continuously applying CVD coatings onto a long moving length of inorganic fibrous material. The method comprises the steps of:

a. while excluding the atmosphere, continuously carrying the fibrous material lengthwise at atmospheric pressure through a heated gaseous mixture comprising one or more reagents that deposit CVD coatings, b. freely exhausting the residue of the gaseous mixture along the path of the fibrous material in the direction of its movement, c. maintaining the fibrous material within the gaseous mixture for a time to deposit a CVD coating onto the moving fibrous material, and d. removing the coated fibrous material from the gaseous mixture.

To enhance the uniformity of the coating thickness distribution, one operates at low temperatures and low partial pressures of the reactants. These conditions favor surface reaction (heterogeneous growth) as opposed to reactions that involve ready nucleation and growth of particles in the gas phase (homogeneous reactions). Such conditions entail relatively low deposition rates and thus limit the speed at which the fibrous material may be pulled through the reactor while still attaining the desired coating thickness. There is thus a compromise between economics and coating thickness uniformity.

For identical deposition conditions, the coating thickness distribution is more uniform on tows than on fabrics, because the filaments are more constrained in the latter. Nevertheless, as will be demonstrated in Example 36, even in fabrics one can completely cover each filament with a CVD deposit.

When the CVD employs two reagents that react readily with each other and so should be separated until they are in position to be deposited on the fibrous material, there preferably is a separate intake for each of those reagents and an additional port between those two intakes for receiving inert gas. This keeps the reagents separated until they have been heated in the furnace tube to the deposition temperature.

For easy cleaning, the inner wall of the furnace tube preferably is cylindrical. To receive a cleaning tool without undue danger of damaging the fibrous material, the inside diameter of a cylindrical furnace tube or its liner preferably is not less than one cm, and more preferably its inside diameter is at least 2 cm. On the other hand, its inside diameter preferably does not exceed 5 cm, because substantially larger diameters may require a wasteful increase in flux. Instead of being cylindrical, tubes with different cross-sectional shapes, e.g., rectangular, may be used.

The length of the furnace tube preferably is from 25 to 50 cm. Substantially longer furnace tubes would make the removal of fuzz and soot difficult. In shorter furnace tubes, some CVD reactions may not yet have reached equilibrium at the outlet, and thus the maximum possible deposit may not yet have formed.

Fibrous materials that can be coated in the novel apparatus are inorganic and include ceramic, carbon, and other high-performance fibers. CVD barrier coatings that can be applied to fibrous materials in the novel apparatus include ceramics, carbon and metals.

Barrier-coated fibrous materials of the invention have utility in toughening inorganic and organic matrices derived from metals, ceramics, glasses, carbon, and polymers. The barrier coatings can improve wetting of the fibrous materials by the matrix, establish a favorable bond strength between the fibrous materials and matrix to further toughen the composite, prevent chemical reaction between fibrous materials and matrix, and prevent dissolution of the fibrous materials in the matrix.

A BRIEF DESCRIPTION OF THE DRAWINGS

In the accompanying drawings, each of which is schematic,

FIG. 7b is a top view of the equipment of FIG. 7a;

DETAILED DESCRIPTION OF THE INVENTION

Figure 1:
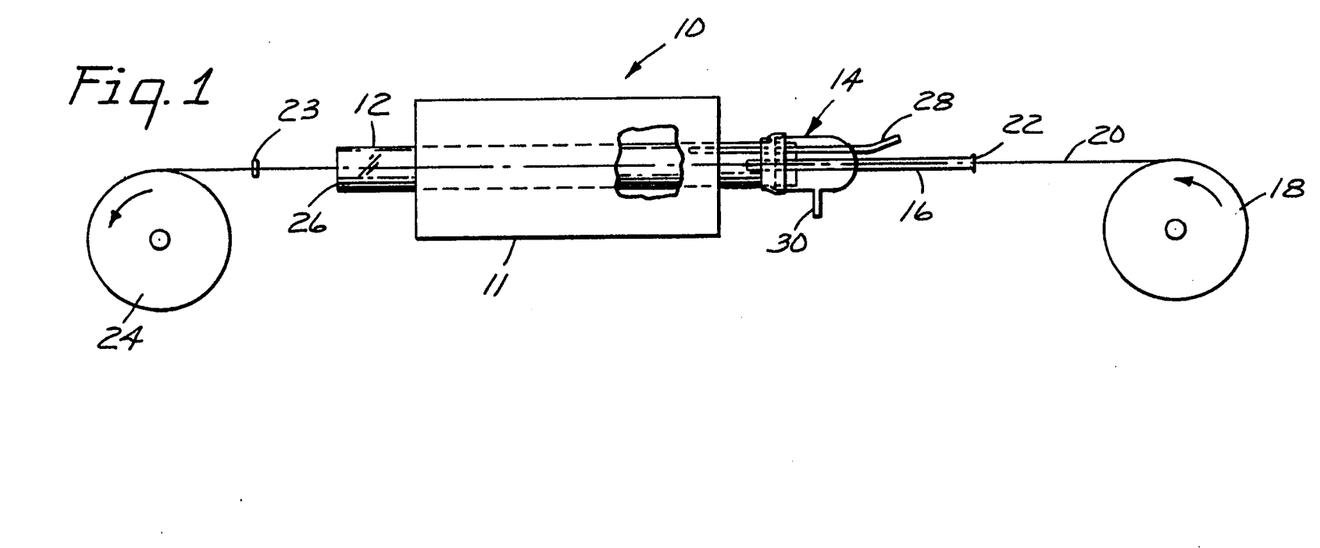
FIG. 1 is a side elevation of APCVD coating apparatus of the invention.

FIG. 1 shows a simple APCVD apparatus 10 that includes a cylindrical furnace 11 and a straight, elongated cylindrical quartz or mullite furnace tube 12 extending beyond the ends of the furnace. The furnace tube 12 has a uniform diameter throughout its length and is fitted with a cap 14 at its fiber-receiving inlet. Fitted into the cap is a long, cylindrical, small-diameter inlet tubing 16, and aligned with the inlet tubing is a supply roll 18 of a continuous tow 20. The inlet tubing 16 has a uniform inside diameter throughout its length and (except being flared outwardly at its entrance 22) is barely large enough to receive the tow. The furnace tube is unconstricted at its outlet 26. Upon exiting from the furnace tube, the tow 20 is drawn across a thread guide 23 and to a take-up roll 24.

The cap 14 is formed with a conduit 28 that serves as an intake for a gaseous mixture including a reagent. The cap also is formed with a second conduit 30 that serves as a port to feed a carrier gas such as argon into the furnace tube 12, which carrier gas may include additional reagent. The total flux, when subjected to the high temperature of the furnace 11, deposits a continuous coating by CVD onto the filaments of the moving tow 20. The flux exiting through the unconstricted outlet 26 should be sufficient to minimize the back diffusion of air such that non-oxide coatings can be attained with acceptable levels of oxygen contamination.

Figures 4, 5:
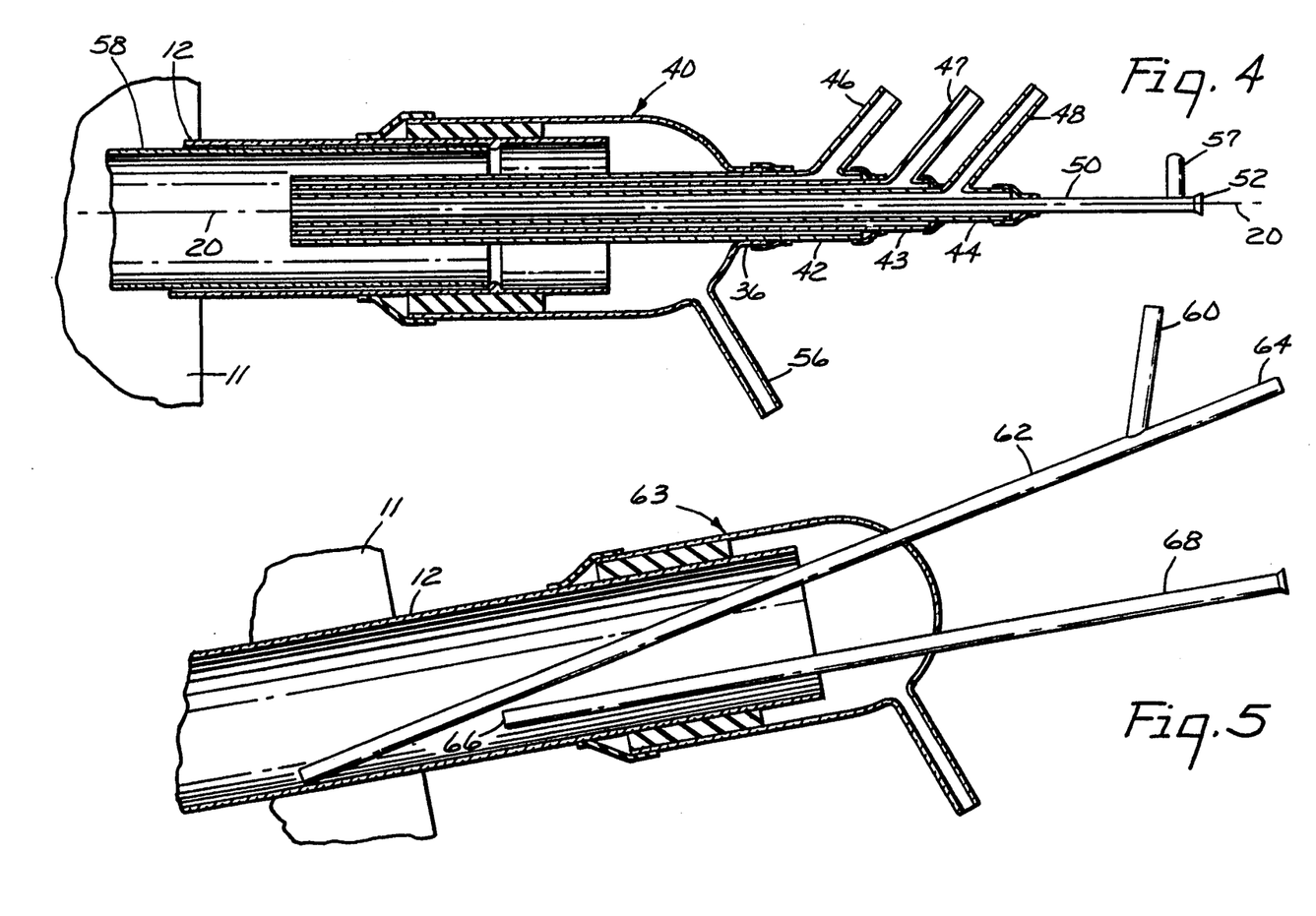
FIG. 4 is a side elevation of equipment that can be substituted into the apparatus of FIG. 1.
FIG. 5 is a side elevation of another variation in the apparatus of FIG. 1.

Deposition takes place not only on the tow 20 but also on the walls of the furnace tube 12. As the cross-sectional area of the furnace tube 12 gradually decreases, the tow rubs more-and-more against the deposit, causing breakage of ever increasing numbers of the filaments until finally the tow breaks entirely, necessitating replacement of the furnace tube. However, to maintain acceptable reproducibility in the properties of the coatings, reproducible gas flow characteristics must also be maintained. It is therefore desirable to change the furnace tube before it becomes clogged and the fibrous material breaks. To avoid having to reattach the inlets, a removable liner 58 may be used as shown in FIG. 4.

Depending on the fibrous material used and on the coating conditions (temperature, gas composition, contact with fuzz, and the deposit on the wall of the reactor), some filaments break off the tow and form a "fuzzball". Also accumulating in the furnace tube are soot particles that form by homogeneous nucleation and growth. Many of these soot particles are carried out by the flux, but others deposit on the wall of the furnace tube and on the fuzzball, densifying the latter. If left in the furnace tube, the fuzzball and soot deplete the gaseous reactants, become cemented together by CVD, and increasingly rub against the fibrous material. This causes breakage of additional filaments and eventually of the whole fibrous material. The elongated tools of FIGS. 2 and 3 are effective for removal of the fuzzballs and soot.

Figure 2:
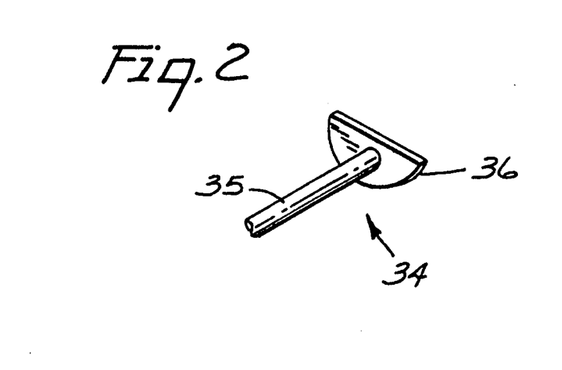
FIG. 2 is a perspective view of a cleaning tool that is useful in the apparatus of FIG. 1.

FIG. 2 shows an elongated tool 34 that can be used to clean the interior of the furnace tube 12. The cleaning tool 34 includes a long rod 35, to the end of which is fixed a semi-circular flange 36, the diameter of which is smaller than the inside diameter of the furnace tube. The flange 36 is semi-circular so that the tow 20 can continue to be drawn through the furnace tube while it is being cleaned. The cleaning tool 34 preferably is formed of fused silica.

Figure 3:
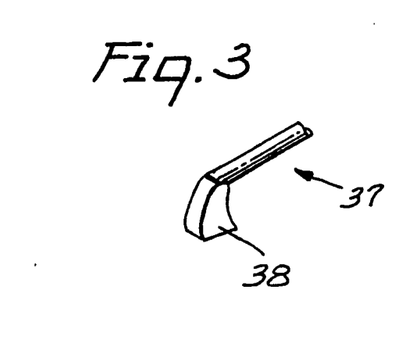
FIG. 3 is a perspective view of another useful cleaning tool.

Another useful cleaning tool 37, as shown in FIG. 3, is formed from a quartz rod to have a flag-shaped projection 38 which is advantageous to use when constriction of the cross-sectional area of the of the furnace tube (or its liner) precludes the use of the tool 34.

For more demanding reactions, the equipment shown in FIG. 4 is substituted into the apparatus of FIG. 1. Fitted over the furnace tube 12 is a cap 40 into which are fitted three coaxial sleeves 42, 43 and 44. The outer and inner sleeves 42 and 44 are formed with conduits 46 and 48, respectively, each for receiving a gaseous mixture of a reactant. The central sleeve 43 has a conduit 47 for receiving inert gas.

Fitted within the inner sleeve 44 is a long, small-diameter cylindrical inlet tubing 50 that is flared outwardly at its entrance 52. The inlet tubing 50 has a uniform inside diameter barely larger than the tow 20 which is being carried through the APCVD apparatus as modified in FIG. 4. Each of the cap 40 and the inlet tubing 50 is formed with a conduit 56 and 57, respectively, for receiving inert gas.

In a modified version of the apparatus shown in FIG. 4 that has been used experimentally, the sleeve 42 was omitted and the second reagent was added through the conduit 56.

The apparatus of FIG. 4 also differs from that of FIG. 1 by a liner 58 that is fitted into the furnace tube 12. The liner is easily replaced and deposits are thus eliminated.

As illustrated in FIG. 5, one may introduce a low-vapor-pressure liquid, by the use of a circulating pump, directly into the furnace tube 12 of FIG. 1 through an arm 60 of a tube 62 that is fitted into a cap 63. The addition of a carrier gas through an inlet 64 of the tube 62 prevents discontinuous, dropwise addition of the reactant. To prevent the buildup of a "puddle" below the exit 66 of a fiber-receiving tubing 68, it is advantageous to tilt the apparatus a few degrees as illustrated.

It is evident to those skilled in the art that a solid reagent may be introduced by an auger.

Figure 6:
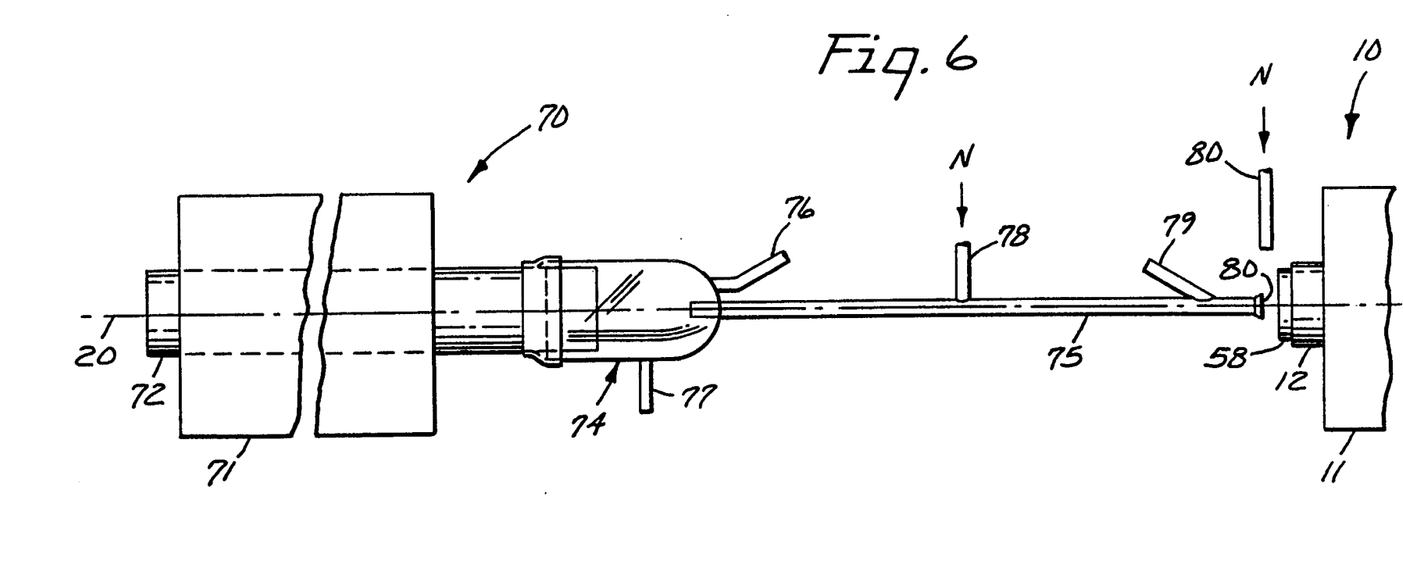
FIG. 6 is a side elevation of equipment for either heat treating or applying a second APCVD coating in-line with the apparatus of FIGS. 1, 4 or 5.

FIG. 6 shows heat-treating or APCVD coating apparatus 70 that include a furnace 71 containing a furnace tube 72 in-line with the furnace tube 12 and liner 58 of FIG. 4. When exposure of the fibrous material to the atmosphere between the two furnaces is undesirable, a long transfer tubing 75 is used, and it has gas inlet arms 78 and 79 that serve to establish the desired atmosphere. The uniform cross-sectional area of the transfer tubing is barely large enough to receive the tow 20 (the path of which is indicated by a phantom line). The length of the transfer tubing 75 is selected so that there is sufficient space to allow cleaning.

The gap between the liner 58 and the transfer tubing 75 is kept small to restrict exposure of the fibrous material to the atmosphere. To further minimize the exposure and to ensure against carrying gases and soot from the liner 58 into the transfer tubing, a conduit 80 directs a neutral gas into the gap. For the same reason, the arm 79 near the inlet 80 to the transfer tubing preferably directs its gas toward the inlet as shown.

The inlet of furnace tube 72 is fitted with cap 74, that is formed with gas inlet conduit 76, through which the desired heat treatment atmosphere is established. To use the second furnace for CVD, conduit 76 would be replaced with the type illustrated as 28 in FIG. 1, thus allowing the discharge of one of the reagents within the furnace 71. The cap 74 is also fitted with a second conduit 77 (corresponding to conduit 30 in FIG. 1).

Figure 7A:
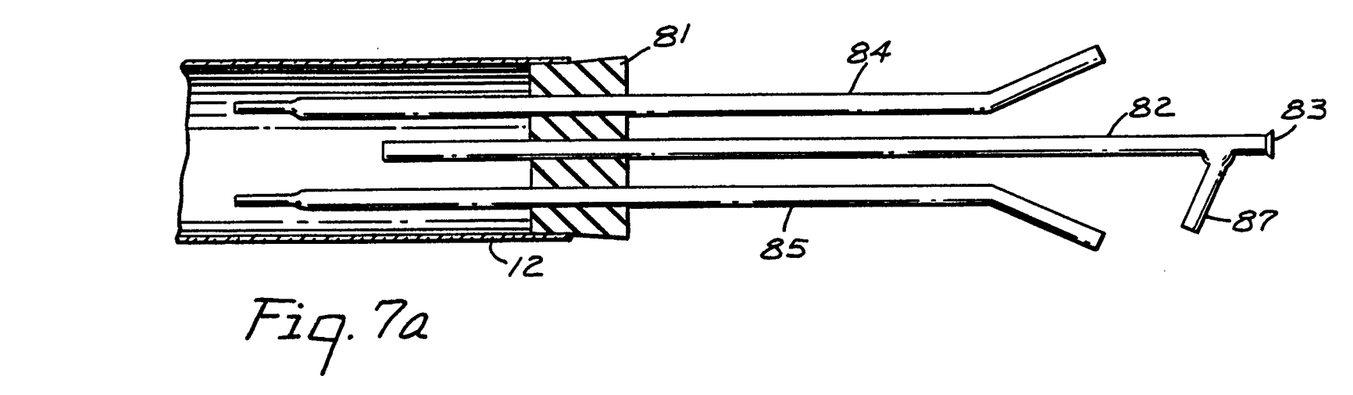
FIG. 7a is a side elevation of additional equipment that can be substituted into the apparatus of FIG. 1.
Figure 7B:
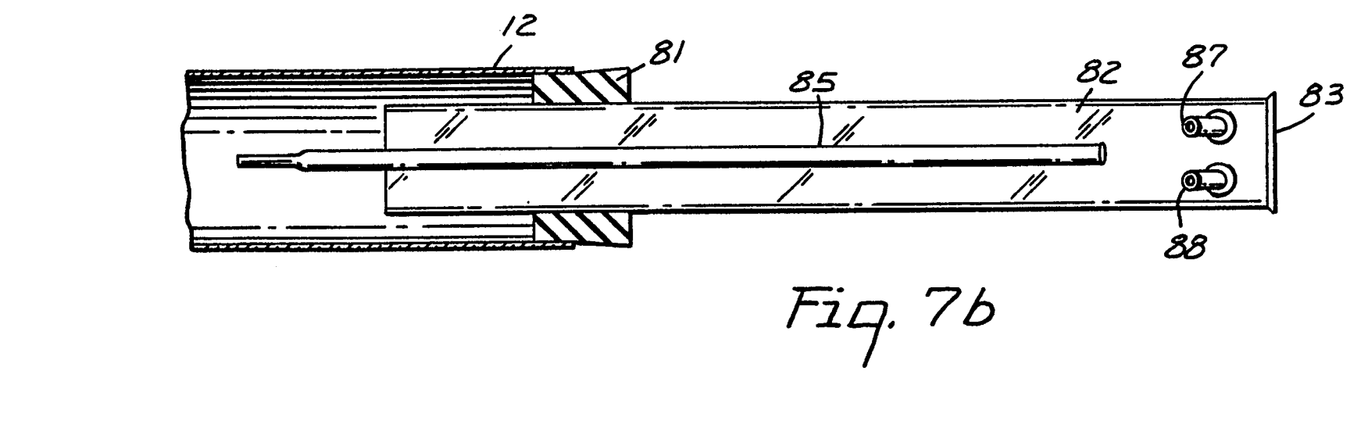
Figure 8:
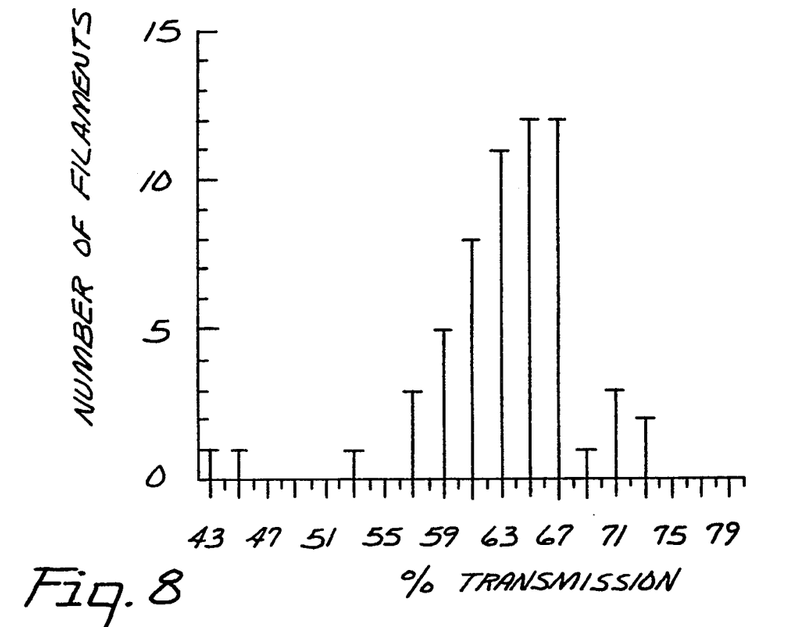
FIG. 8 is a histogram of light transmission through mullite fibers that have received a SiC coating as described in Example 1.
Figure 9:
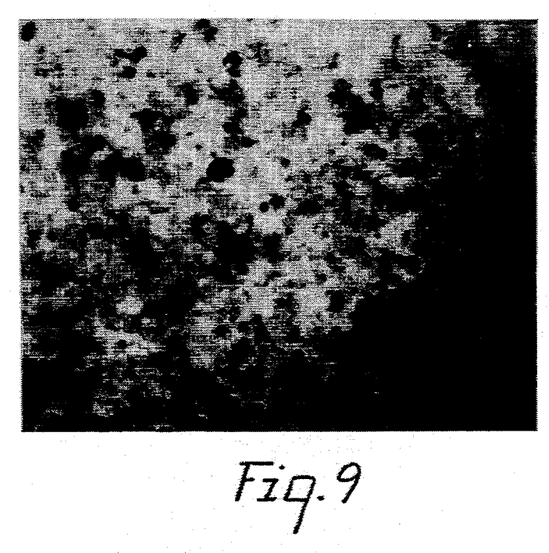
FIG. 9 is a 100,000X TEM micrograph of a CVD coating produced according to Example 1.

FIGS. 7a and 7b show two views of equipment for modifying apparatus 10 of FIG. 1 for the coating of a continuous narrow strip of fabric or a plurality of side-by-side tows (not shown). Fitting through a stopper 81 in the inlet of the furnace tube 12 is a long inlet tubing 82 having a uniform slot-like cross-sectional area, except being flared outwardly at its entrance 83. The slot-like area is barely large enough to receive fibrous material to be coated. Also fitting through the stopper 81 are a pair of conduits 84 and 85, through each of which a gaseous mixture of one or more CVD reagents is fed. To keep out air, a stream of inert gas is passed through each of a pair of arms 87 and 88 formed in the inlet tubing 82.

FIGS. 8-11 are discussed in connection with the working examples below.

In most cases, fibrous material to be coated is sized. The sizing is easily removed by passing the fibrous material, prior to entering the CVD apparatus, through an open-tube furnace at a temperature sufficient to burn off the sizing. When it is desirable to size fibrous material after it has been coated by CVD, this can be done continuously between the coater and the takeup spool.

In some cases, the fibrous material to be coated should be protected from the CVD atmosphere. In case of NEXTEL ® 480, this can be accomplished by depositing a carbon coating during the preparation of the fiber. Alternatively, sizing may be pyrolized in an inert atmosphere. If a thicker carbon subcoat is desired, a gaseous carbon source may be added to the inert gas stream. A carbon subcoat may also have the additional advantage of establishing a favorable bond strength between the fibrous material and the CVD coating. Subcoats other than carbon (e.g., BN) can provide the same advantages.

Penetration of the reagents between the filaments can be beneficially affected by pulsing the gas flow. This is accomplished by passing at least one of the gas streams through a valve that can be set, e.g., at one-second-on/one-second-off, such as valve No. 52C19T34-8 available from Valcor Engineering Corp., of Springfield, N.J.

It is evident to those skilled in the art that the properties of the coatings can be varied by changing the composition of the reactants, their partial pressures and flow rates, and the deposition temperature. Materials with narrow homogeneity regions, such as SiC, can be deposited with or without excess silicon or carbon by the suitable choice of temperature and of the Si/C/H ratio in the reactant gas stream. See, for example, H. J. Kim & R. F. Davis, *J. Appl. Phys.*, Vol. 60, p. 2897 (1986). In the case of coatings with a wide homogeneity range, such as $Ti_xC_{1-x}$, the value of x can be predetermined by the suitable choice of temperature and of the partial pressures of the reactants. See F. Teyssandier, et al., *J. Electrochem. Soc.*, Vol. 165, p. 225 (1988).

The temperature range of the process can be lowered by using highly reactive gas(es) for example, $SiH_4$ or $BH_3$ as the sources for silicon and boron respectively.

The coatings deposited at low temperatures tend to be amorphous. If highly crystalline coatings are desired, higher temperatures should be employed. In the case of highly reactive gases, this leads to homogeneous nucleation and growth, i.e. to poor quality coatings and low yield. Hence it is advantageous to use less-reactive gases. For example, in the case of carbon, $CH_4$ may be used instead of unsaturated or higher molecular weight hydrocarbons. However, if too high a temperature is used, grain growth can take place in both the fiber and the coating, and this can adversely affect the mechanical properties. Also, other variables being constant, the number of filaments that break during the coating process increases with increasing temperature.

Using the process taught in this invention, coatings can be deposited on any fibrous material that is stable in the CVD gas stream at the deposition temperature. In the case of corrosive reactants, a thin precoat of a non-reactive material as a protective barrier allows the deposition of the desired coating.

As examples of the practice of the present invention, the following fibers were coated: aluminum borosilicate and mullite fibers, specifically the family of NEXTEL ® fibers available from 3M Company, alumina fiber SV-01-1K available from Sumitomo; an alumina-zirconia fiber PRD166 available from E. I. duPont; and a carbon fiber AS4 G-12K available from Hercules.

Any suitable inert gas such as nitrogen, helium, argon, and neon can be used as the carrier gas.

Useful classes of refractory barrier coatings for the present invention include oxides, carbides, borides, nitrides, silicides, carbon and metals.

From the above discussion it can be seen by one skilled in the art that the properties of the barrier coatings (thickness, composition, crystallinity) can be varied at will, and that for a given set of coating properties, deposition conditions can be selected to minimize materials and process costs.

The techniques that were used for the evaluation of the barrier coatings are illustrated below:

Characterization Methods

To evaluate the usefulness of the present invention, it is necessary to determine the coating thickness distribution, the grain structures of the coatings, and the strengths of the coated fibers. The following characterization techniques were used:

Optical

Coating quality on transparent fiber was qualitatively determined by optical microscopy. The coated filaments were examined in cross-polarized light, preferably in the index oil corresponding to their refractive index. The coatings caused bright lines to appear at the two edges of the filaments. These lines were brightest at 45° orientations to the planes of polarization. The continuity and intensity of the lines is a qualitative indication of coating quality. Color of the lines, being due to interference between light reflected at the filament-coating interface and at the surface of the coating, allowed the qualitative calculation of the coating thickness.

A measure of coating thickness uniformity was obtained in the case of colored coatings on transparent fibers by measuring the light transmission through a number of filaments in an index oil matched to their refractive index. This approach assumes the absorption is proportional to the coating thickness. The measurements were made using the Zeiss PM1 photometer with a circular aperture of 630 micrometers. The 100% transmission was set in a filament-free area. The percent transmission was plotted as a histogram. It shows the degree of coating thickness control obtainable by the present invention.

Mechanical Test Methods

The mechanical test results were determined using a Sintech Inc. (Stoughton, Mass.) computer-controlled load frame. A 1000-lb load cell, equipped with Instron Model No. 2712-003 pneumatic grips with rubber coated faces (Instron catalog #2702-015), was used for the tensile testing of the fibrous material. The gauge length for "Strand Strength" measurements was 15.24 cm. "Bend Strength" determinations were made using fiber samples which were 7.6 cm in length, bending them around a 1.27 mm diameter rod, and then applying tension.

Other Methods

SEM was used for the determination of the morphology of the coatings. Examination of fracture cross-sections allowed estimation of coating thickness. Observation of the degree of spalling, if any, adjacent to the fracture gave a qualitative indication of bond strength between fiber and coating.

TEM allowed the determination of crystal and grain structure.

Depth profiles obtained by Auger electron spectroscopy revealed the composition and, if any, the change in composition through the coating.

ESCA was used for the determination of composition and bonding in and near the surface. Due to the inability of the technique of focusing at a single filament, it cannot give depth profiles.

Elements in the coating that do not form part of the fiber were determined by standard techniques, e.g., by ICP or for carbon and nitrogen by the LECO method.

The electrical resistance was roughly determined by contacting the coated fibers with two probes.

Comparisons of results obtained on the same sample by various methods could in many cases be used for the estimation of their accuracy.

Various modifications and alterations of this invention will become apparent to those skilled in the art without departing from the scope and spirit of this invention. Therefore, it should be understood that this invention is not to be limited to the following examples in which parts are given by weight.

EXAMPLES

Example 1

In this example, the apparatus was like that of FIG. 1 having length of furnace 11: 30 cm
inside diameter of furnace tube 12: 2.5 cm
inside diameter of inlet tubing 16: 0.4 cm Hydrogen (190 cc/min) was bubbled through boiling $(CH_3)_2SiCl_2$ to produce a gaseous mixture that was passed through a 20° C. reflux condenser and then through conduit 28 of FIG. 1 (called "Flux 1" in Table I). Argon (2100 cc/min) was passed through conduit 30 (called "Flux 2" in Table I). The apparatus was used to coat a 2000-denier, 760-filament tow (mullite with a 2% $B_2O_3$ content available as NEXTEL ® 480) that had a 0.2% carbon coating. This tow was pulled through the furnace tube (kept at 1050° C.) at 37 cm/min to provide a CVD coating about 100 nm in thickness as measured by electron microscopy and verified by calculations based on elemental analysis of carbon.

The resulting filaments of the tow had infinite electrical resistance. Their barrier coatings of SiC afforded a golden color to the filaments. Uniform orange-colored lines observed under cross-polarized light indicated a uniform coating thickness of about 130 nm. The coating thickness distribution, as shown by a histogram (FIG. 8) based on light absorption, was reasonably narrow. The composition of the CVD coating, as indicated by an Auger depth profile, was stoichiometric. A TEM micrograph (FIG. 9) showed most of the grains to be 1 to 3 nm in size.

Figure 10:
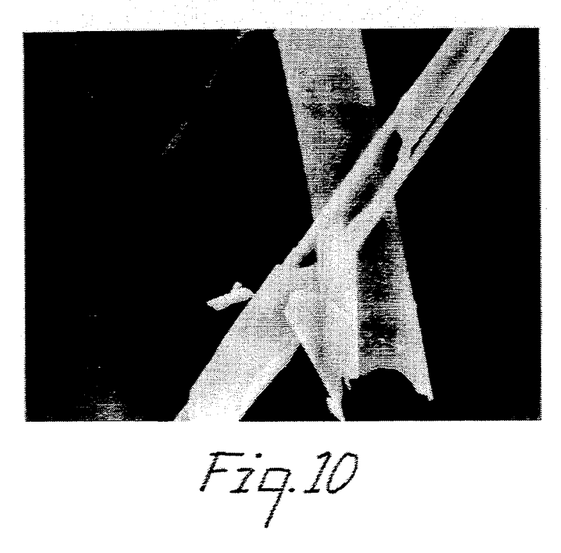
FIG. 10 is a 390X SEM micrograph of CVD coatings after chemical removal of the filaments to which they had been applied.

Etching away the mullite cores with aqueous HF allowed the hulls to be observed (FIG. 10).

Examples 2–23

Lengths of the same carbon-coated tow used in Example 1 were provided with different CVD barrier coatings by the procedure of Example 1 except as indicated in Table I and except that Examples 10, 19 and 22 were coated using a concentric sleeve apparatus similar to that of FIG. 4; Examples 6 and 23 were coated using apparatus as shown in FIG. 5, with the xylene and $Zr(BuO)_4$ added as liquids. In Examples 14–16 and 31, TFAA denotes trifluoroacetic anhydride. About half of the filaments of Examples 3 and 4 that were coated with BN had white edges, thus indicating a thickness less than 170 nm. The other half had yellow edges, indicating a thickness exceeding 170 nm.

The last column in TABLE I gives the weight precent carbon that was deposited onto the fiber during its manufacture.

Examples 24–33

Most of the barrier coatings of Examples 1–23 caused deterioration in strength, especially in bend strength. However, undercoating with BN and/or with carbon counteracted the deterioration. Hence, lengths of the tow used in Example 1 were provided with CVD barrier coatings in the same manner as in Example 1 except that they were passed through the apparatus more than once. The deposition conditions of the multiple coatings are listed in Table II, with the outer coating listed first.

Figure 11:
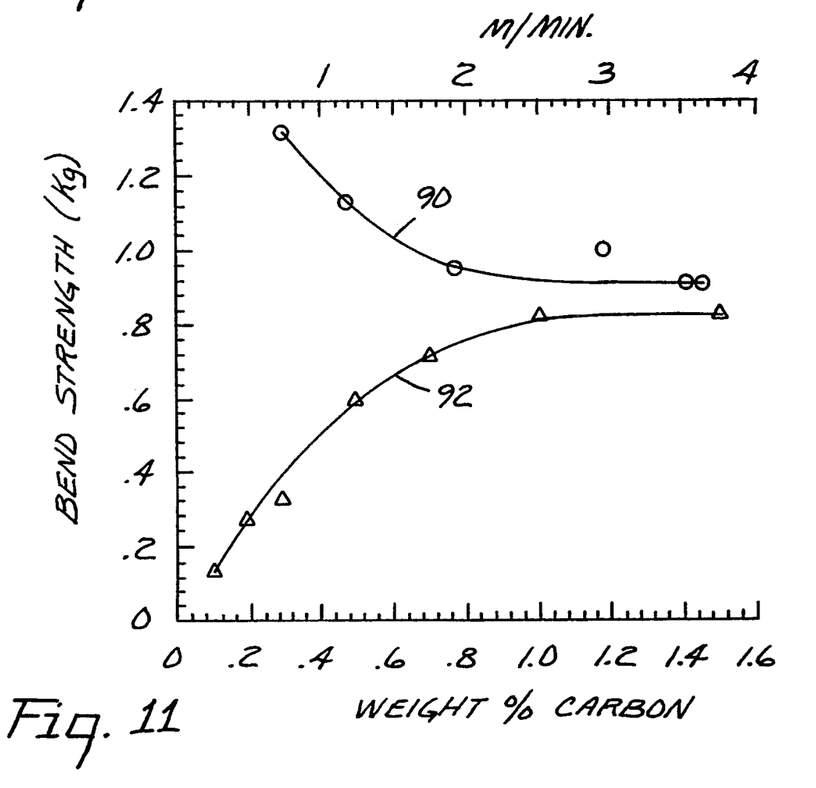
FIG. 11 shows the effect of undercoating with carbon and BN on bend strength of SiC-coated ceramic fibers.

The effects of BN and carbon undercoats on the bend strengths of SiC-coated NEXTEL ® 480 fibers were charted in FIG. 11 as curves 90 and 92, respectively. To generate the curve 90, the thickness of the BN layer was adjusted by changing the pulling speed between 0.73 and 3.54 m/min. It may be assumed that the coating thickness is an inverse function of the pulling speed. The pulling speed was likewise changed to provide fibers with varying weight percents of carbon as indicated by the curve 92.

Examples 34–35

Again proceeding as in Example 1, the simultaneous deposition of more than one phase yielded composite coatings as indicated in Table II. In Example 35 a 4000 denier NEXTEL ® 480 was coated.

like that of FIG. 6 (80 cm long, 1150° C.) through which a stream of nitrogen was flowing. The resulting tows had improved resistance to hydrolysis as compared to tows that had been CVD coated in the same way except without heat-treatment. By performing heat treatments in oxidizing atmospheres, e.g., in air, oxynitrides were prepared. There was variation in the strength values of the various batches of fibers that were used as substrates.

Properties of the coated fibers of Examples 1–35 are listed in Table III. Most of the strength figures are averages of five measurements. An entry 0.0 indicates that the fiber was too weak to allow meaningful measurements to be made. The deviations in strand strength and bend strength refer to the change in strength relative to the uncoated tow, except in case of the multiple coatings where the values prior to the deposition of the outermost layer were the reference (in Examples 32 and 33, the changes from the uncoated tow are listed).

TABLE I

| EXPL. | COATING | FLUX 1 | | | | FLUX 2 | | | | °C. | cm/min | CARBON SUBCOAT % |
|---|---|---|---|---|---|---|---|---|---|---|---|---|
| | | | $cm^3/min$ | | $cm^3/min$ | | $cm^3/min$ | | $cm^3/min$ | | | |
| 1 | SiC | $(CH_3)_2SiCl_2$ | 30 | $H_2$ | 190 | Ar | 2100 | | | 1050 | 37 | 0.2 |
| 2 | AlN | $AlCl_3$ | 40 | $H_2$ | 190 | $NH_3$ | 1060 | $N_2$ | 1900 | 700 | 91 | 0.2 |
| 3 | BN | $Et_3B$ | 100 | $N_2$ | 1670 | $NH_3$ | 1650 | $N_2$ | 425 | 1050 | 73 | None |
| 4 | BN | $Et_3B$ | 100 | $N_2$ | 1670 | $NH_3$ | 1650 | $N_2$ | 425 | 1050 | 354 | None |
| 5 | $B_4C$ | $BCl_3$ | 116 | Ar | 650 | $Et_3B$ | 1212 | $H_2$ | 1350 | 1100 | 91 | 0.1 |
| 6 | C | xylene | 60 | $N_2$ | 1100 | $N_2$ | 400 | | | 1000 | 107 | None |
| 7 | Mo | $MoCl_5$ | 24 | Ar | 590 | $H_2$ | 1000 | Ar | 280 | 700 | 30 | 0.2 |
| 8 | $MoSi_2$ | $MoCl_5$ | 20 | Ar | 500 | $SiCl_4$ | 200 | Ar | 810 | 1000 | 30 | 0.2 |
| 9 | $SiO_2$ | $Si(OEt)_4$ | 23 | $N_2$ | 670 | | | | | 700 | 30 | None |
| 10 | $Si_3N_4$ | SiCl | 83 | $N_2$ | 2200 | $NH_3$ | 760 | | | 1100 | 137 | None |
| 11 | $SnO_2$ | $(CH_3)_4Sn$ | 42 | Ar | 420 | air | 1670 | | | 500 | 61 | None |
| 12 | $SnO_2$ | $(CH_3)_4Sn$ | 42 | Ar | 420 | air | 1670 | | | 500 | 122 | None |
| 13 | $SnO_2$ | $(CH_3)_4Sn$ | 42 | Ar | 420 | air | 1670 | | | 500 | 30 | 0.5 |
| 14 | $SnO_2$ + F | $(CH_3)_4Sn$ | 42 | Ar | 470 | air | 1670 | TFAA | 6 | 500 | 61 | None |
| 15 | $SnO_2$ + F | $(CH_3)_4Sn$ | 42 | Ar | 470 | air | 1670 | TFAA | 6 | 500 | 122 | None |
| 16 | $SnO_2$ + F | $(CH_3)_4Sn$ | 42 | Ar | 470 | air | 1670 | TFAA | 6 | 500 | 30 | 0.5 |
| 17 | $TaN_2$ | $TaCl_5$ | 7 | $N_2$ | 720 | $H_2$ | 1000 | | | 800 | 85 | 0.2 |
| 18 | $TiB_2$ | $TiCl_4$ | 40 | $H_2$ | 480 | $Et_3B$ | 80 | Ar | 1350 | 900 | 91 | 0.1 |
| 19 | $TiB_2$ | $TiCl_4$ | 180 | Ar | 1600 | $BCl_3$ | 140 | $H_2$ | 1400 | 1000 | 354 | 0.5 |
| 20 | TiN | $TiCl_4$ | 32 | $H_2$ | 3200 | $N_2$ | 1200 | | | 1000 | 183 | 0.2 |
| 21 | TiN | $TiCl_4$ | 32 | $H_2$ | 3200 | $N_2$ | 1200 | $NH_3$ | 40 | 1000 | 183 | 0.2 |
| 22 | ZrN | $ZrCl_4$ | 126 | $N_2$ | 740 | $NH_3$ | 490 | $N_2$ | 820 | 1000 | 91 | 0.1 |
| 23 | $ZrO_2$ | $Zr(BuO)_4$ | 30 | $N_2$ | 1420 | $CO_2$ | 490 | | | 500 | 61 | 0.1 |

Heat-Treatment

When each of the tows of Examples 2, 24 and 34 was coated, it was carried in-line through a second furnace

TABLE II

| EXPL. | | FLUX 1 | | | | FLUX 2 | | | | °C. | cm/min | CARBON SUBCOAT % |
|---|---|---|---|---|---|---|---|---|---|---|---|---|
| | | | $cm^3/min$ | | $cm^3/min$ | | $cm^3/min$ | | $cm^3/min$ | | | |
| MULTIPLE COATINGS | | | | | | | | | | | | |
| 24 | AlN | $AlCl_3$ | 40 | $H_2$ | 190 | $NH_3$ | 1060 | $N_2$ | 1900 | 700 | 91 | |
| | BN | $Et_3B$ | 100 | $N_2$ | 1670 | $NH_3$ | 1650 | $N_2$ | 425 | 1050 | 150 | 0.1 |
| 25 | C | xylene | 60 | $N_2$ | 1100 | | | | | 1000 | 122 | |
| | BN | $Et_3B$ | 100 | $N_2$ | 1670 | $NH_3$ | 1650 | $N_2$ | 425 | 1050 | 150 | 0.1 |
| 26 | SiC | $(CH_3)_2SiCl_2$ | 30 | $H_2$ | 190 | Ar | 2100 | | | 1050 | 37 | |
| | BN | $Et_3B$ | 100 | $N_2$ | 1670 | $NH_3$ | 1650 | $N_2$ | 425 | 1050 | 73 | 0.0 |
| 27 | SiC | $(CH_3)_2SiCl_2$ | 30 | $H_2$ | 190 | Ar | 2100 | | | 1050 | 259 | |
| | BN | $Et_3B$ | 100 | $N_2$ | 1670 | $NH_3$ | 1650 | $N_2$ | 425 | 1050 | 107 | 0.0 |
| | SiC | $(CH_3)_2SiCl_2$ | 30 | $H_2$ | 190 | Ar | 2100 | | | 1050 | 37 | |
| 28 | SiC | $(CH_3)_2SiCl_2$ | 30 | $H_2$ | 190 | Ar | 2100 | | | 1050 | 37 | 0.2 |
| | C | xylene | 25 | $N_2$ | 1100 | $N_2$ | 380 | | | 1000 | 107 | |
| 29 | $Si_3N_4$ | $SiCl_4$ | 83 | $N_2$ | 2200 | $NH_3$ | 260 | | | 1000 | 137 | |
| | BN | $NH_3$ | 490 | | | $BCl_3$ | 50 | $N_2$ | 1900 | 1000 | 150 | None |
| 30 | $SnO_2$ | $(CH_3)_4Sn$ | 42 | Ar | 420 | air | 1670 | | | 500 | 30 | |
| | BN | $Et_3B$ | 100 | $N_2$ | 1670 | $NH_3$ | 1650 | $N_2$ | 425 | 1050 | 90 | None |
| 31 | $SnO_2$ + F | $(CH_3)_4Sn$ | 42 | Ar | 470 | air | 1670 | TFAA | 20 | 500 | 30 | |
| | BN | $Et_3B$ | 100 | $N_2$ | 1670 | $NH_3$ | 1650 | $N_2$ | 425 | 1050 | 150 | None |
| 32 | $TiB_2$ | $TiCl_4$ | 180 | Ar | 1600 | $BCl_3$ | 140 | | | 1000 | 354 | |
| | C | xylene | 29 | $N_2$ | 1100 | $N_2$ | 380 | | | 1000 | 305 | |
| | BN | $Et_3B$ | 100 | $N_2$ | 1670 | $NH_3$ | 1650 | $N_2$ | 425 | 1050 | 150 | 0.1 |

TABLE II-continued

| EXPL. | | FLUX 1 | | | | FLUX 2 | | | | °C. | cm/min | CARBON SUBCOAT % |
|---|---|---|---|---|---|---|---|---|---|---|---|---|
| | | | cm³/min | | cm³/min | | cm³/min | | cm³/min | | | |
| 33 | TiC | TiCl₄ | 36 | H₂ | 680 | CH₄ | 46 | Ar | 2270 | 1100 | 91 | |
| | BN | Et₃B | 100 | N₂ | 1670 | NH₃ | 1650 | N₂ | 425 | 1050 | 90 | 0.1 |
| COMPOSITE COATINGS | | | | | | | | | | | | |
| 34 | AlN—BN | Et₃B | 126 | N₂ | 2100 | AlCl₃ | 18 | N₂ | 420 | 800 | 61 | 0.1 |
| | | | | | | NH₃ | 1060 | | | | | |
| 35 | SiC—TiC | CH₃SiCl₃ | 30 | N₂ | 1700 | TiCl₄ | 50 | CH₄ | 40 | 1150 | 73 | 0.1 |

TABLE III

| EXPL | | COLOR | ELECTRICAL RESISTANCE (k Ω/m) | STRAND STRENGTH (kg) | DEV. (%) | BEND STRENGTH (kg) | DEV. (%) |
|---|---|---|---|---|---|---|---|
| SINGLE COATING | | | | | | | |
| 1 | SiC | golden | ∞ | 2.4 | −33 | 0.3 | −92 |
| 2 | AlN | *grey | 9000 | 3.9 | −30 | 1.6 | −48 |
| 3 | BN | straw | ∞ | 4.2 | −4 | 3.2 | −4 |
| 4 | BN | straw | ∞ | 3.2 | −27 | 3.0 | −12 |
| 5 | B₄C | black | 3 × 10⁴ | 1.7 | −64 | 1.0 | −74 |
| 6 | C | black | 76 | 4.2 | −5 | 3.6 | 7 |
| 7 | Mo | black | 2.4 | 4.7 | −16 | 2.7 | 45 |
| 8 | MoSi₂ | black | 400 | 4.1 | −28 | 1.9 | 2 |
| 9 | SiO₂ | white | ∞ | 2.9 | | 2.2 | −30 |
| 10 | Si₃N₄ | white | ∞ | 1.2 | | 1.2 | |
| 11 | SnO₂ | *golden | 32 | 1.9 | −56 | 0.0 | |
| 12 | SnO₂ | white | 10 | 2.2 | −48 | 0.5 | −86 |
| 13 | SnO₂ | black | 32 | 3.1 | −36 | 0.5 | −91 |
| 14 | SnO₂ + F | *olive | 2.4 | 1.8 | −57 | 0.0 | |
| 15 | SnO₂ + F | white | 10 | 2.1 | −51 | 0.5 | −81 |
| 16 | SnO₂ + F | black | 1.4 | 4.2 | −15 | 0.5 | −86 |
| 17 | Ta₂N | black | 5.6 | 5.9 | 0 | 1.7 | −7 |
| 18 | TiB₂ | black | 8 | 5.9 | 28 | 2.8 | −30 |
| 19 | TiB₂ | black | 4 | 4.9 | 0 | 0.7 | −70 |
| 20 | TiN | black | 170–6700 | 2.6 | −52 | 1.0 | −75 |
| 21 | TiN | golden | 1.1 | 0.0 | | 0.0 | |
| 22 | ZrN | olive | ∞ | 5.1 | 0 | 1.8 | |
| 23 | ZrO₂ | white | ∞ | 3.8 | −20 | 3.2 | 10 |
| MULTIPLE COATINGS | | | | | | | |
| 24 | AlN/BN | grey | ∞ | 4.5 | −3 | 2.4 | −34 |
| 25 | C/BN | black | 28 | 5.6 | 21 | 2.7 | −32 |
| 26 | SiC/BN | golden | ∞ | 4.2 | 0 | 1.3 | −59 |
| 27 | SiC/BN/SiC | golden | ∞ | 4.2 | −21 | 2.4 | −11 |
| 28 | SiC/C | black | 160 | 3.2 | −27 | 0.8 | −75 |
| 29 | Si₃N₄/BN | white | ∞ | 1.2 | | 1.2 | |
| 30 | SnO₂/BN | *golden | 36 | 2.0 | −25 | 0.5 | −84 |
| 31 | SnO₂ + F/BN | olive | 1.4 | 2.3 | −7 | 0.5 | −84 |
| 32 | TiB₂/C/BN | black | 4 | 4.6 | 0 | 3.0 | 0 |
| 33 | TiC/BN | black | 6 | 5.4 | −10 | 4.4 | 76 |
| COMPOSITE COATINGS | | | | | | | |
| 34 | AlN—BN | *grey | ∞ | 4.5 | −12 | 3.1 | 35 |
| 35 | SiC—TiC | grey | 1 × 10⁴ | 7.6 | −25 | 1.7 | −68 |

*light color

Example 36

With the apparatus of FIG. 1 modified as in FIG. 7a and 7b, the procedure of Example 1 (with the changes noted) was used to coat a 2.5 cm wide woven borosilicate woven fabric (NEXTEL ® 440) at a speed of 30 cm/min. Argon was passed through a solenoid value (one-second-on, one-second-off) and then through the conduit 84 at a rate of 2140 ml/min. Into the conduit 85 was fed a gaseous mixture of $(CH_3)_2SiCl_2$ (120 ml/min) and hydrogen (720 ml/min). The temperature in the reaction zone was maintained at 1050° C. The tape inlet tubing 82 was purged with streams of argon to keep air out of the reactor.

The SiC-coated fabric was golden colored. In cross-polarized light, all filaments of the fabric showed orange lines. They were all completely coated.

We claim:

1. Method of continuously applying CVD coatings onto a long moving length of inorganic fibrous material, said method comprising the steps of
   a. continuously carrying the fibrous material lengthwise at atmospheric pressure through a heated gaseous mixture comprising one or more reagents that deposit CVD coatings and any feed carrier gas to provide a flux,
   b. freely exhausting the residue of said gaseous mixture along the path of the fibrous material in the direction of its movement while maintaining back diffusion of atmospheric air at an acceptable level by the flux,
   c. maintaining the fibrous material within said gaseous mixture for a time to deposit a CVD coating onto the moving fibrous material,
   d. removing the coated fibrous material from said gaseous mixture, and e. periodically removing deposits of fuzz and soot without interrupting the coating process.

2. Method as defined in claim 1 and further comprising heat-treating the CVD-coated fibrous material while restricting exposure of the coated fibrous material to the atmosphere.

3. Method as defined in claim 1 wherein said fibrous material comprises a tow.

4. Method as defined in claim 1, step (a) of which involves carrying a plurality of tows in side-by-side contact through said gaseous mixture.

5. Method as defined in claim 1 wherein said fibrous material comprises a strip of fabric.

* * * * *

UNITED STATES PATENT AND TRADEMARK OFFICE
CERTIFICATE OF CORRECTION

PATENT NO.: 5,364,660

DATED: November 15, 1994

INVENTOR(S): Gabor et al.

It is certified that error appears in the above-identified patent and that said Letters Patent is hereby corrected as shown below:

Col. 2, line 2, "necessary no diffuse" should be --necessary to diffuse--.

Col. 3, line 1, "surface each" should be --surface of each--.

Col. 11/12, TABLE I, between the lines for Expl. 8 and Expl. 9, under the heading
"          FLUX 2
   $cm^3$/min      $cm^3$/min     " should be
      --$H_2$         1000--

Signed and Sealed this

Twentieth Day of June, 1995

*Attest:*

BRUCE LEHMAN

*Attesting Officer*   Commissioner of Patents and Trademarks